(12) United States Patent
Kawai

(10) Patent No.: US 12,082,338 B2
(45) Date of Patent: Sep. 3, 2024

(54) PRINTED WIRING BOARD

(71) Applicant: IBIDEN CO., LTD., Gifu (JP)

(72) Inventor: Satoru Kawai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 20 days.

(21) Appl. No.: 17/744,069

(22) Filed: May 13, 2022

(65) Prior Publication Data

US 2022/0369457 A1    Nov. 17, 2022

(30) Foreign Application Priority Data

May 17, 2021  (JP) .................................. 2021-083265

(51) Int. Cl.
| | | |
|---|---|---|
| *H05K 1/11* | (2006.01) | |
| *H05K 3/40* | (2006.01) | |
| *H05K 3/46* | (2006.01) | |

(52) U.S. Cl.
CPC ........... *H05K 1/112* (2013.01); *H05K 3/4007* (2013.01); *H05K 3/4644* (2013.01)

(58) Field of Classification Search
CPC ........ H05K 1/11; H05K 1/112; H05K 3/4007; H05K 3/4644

USPC ......................................................... 174/262
See application file for complete search history.

(56) References Cited

U.S. PATENT DOCUMENTS

2017/0358518 A1*  12/2017  Wu .......................... H01L 21/78

FOREIGN PATENT DOCUMENTS

JP          2011-124559 A      6/2011

* cited by examiner

*Primary Examiner* — Tremesha S Willis
(74) *Attorney, Agent, or Firm* — Oblon, McClelland, Maier & Neustadt, L.L.P.

(57) ABSTRACT

A printed wiring board includes a resin insulating layer, pads formed on the resin insulating layer, an uppermost resin insulating layer formed on the resin insulating layer such that the uppermost resin insulating layer is covering the pads and has openings exposing the pads, respectively, via conductors formed in the uppermost resin insulating layer such that the via conductors are formed on the pads exposed from the openings in the uppermost resin insulating layer, respectively, and metal posts formed on the via conductors such that each of the metal posts has a portion on a surface of the uppermost resin insulating layer around the via conductors and a side surface having a flared bottom extending toward the uppermost resin insulating layer.

20 Claims, 6 Drawing Sheets

PRINTED WIRING BOARD

CROSS-REFERENCE TO RELATED APPLICATIONS

The present application is based upon and claims the benefit of priority to Japanese Patent Application No. 2021-083265, filed May 17, 2021, the entire contents of which are incorporated herein by reference.

BACKGROUND OF THE INVENTION

Field of the Invention

A technology disclosed herein relates to a printed wiring board.

Description of Background Art

Japanese Patent Application Laid-Open Publication No. 2011-124559 describes a package substrate that includes: a substrate having conductive pads; an insulating layer that is formed on the substrate and has openings that expose the conductive pads; a peeling prevention layer that is formed on the conductive pads in the openings and is formed along side walls of the insulating layer and higher than an upper surface of the insulating layer; post terminals formed on the peeling prevention layer; and solder bumps formed on the post terminals. The peeling prevention layer is formed of copper. The post terminals are formed of an alloy of tin and copper. The entire contents of this publication are incorporated herein by reference.

SUMMARY OF THE INVENTION

According to one aspect of the present invention, a printed wiring board includes a resin insulating layer, pads formed on the resin insulating layer, an uppermost resin insulating layer formed on the resin insulating layer such that the uppermost resin insulating layer is covering the pads and has openings exposing the pads, respectively, via conductors formed in the uppermost resin insulating layer such that the via conductors are formed on the pads exposed from the openings in the uppermost resin insulating layer, respectively, and metal posts formed on the via conductors such that each of the metal posts has a portion on a surface of the uppermost resin insulating layer around the via conductors and a side surface having a flared bottom extending toward the uppermost resin insulating layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
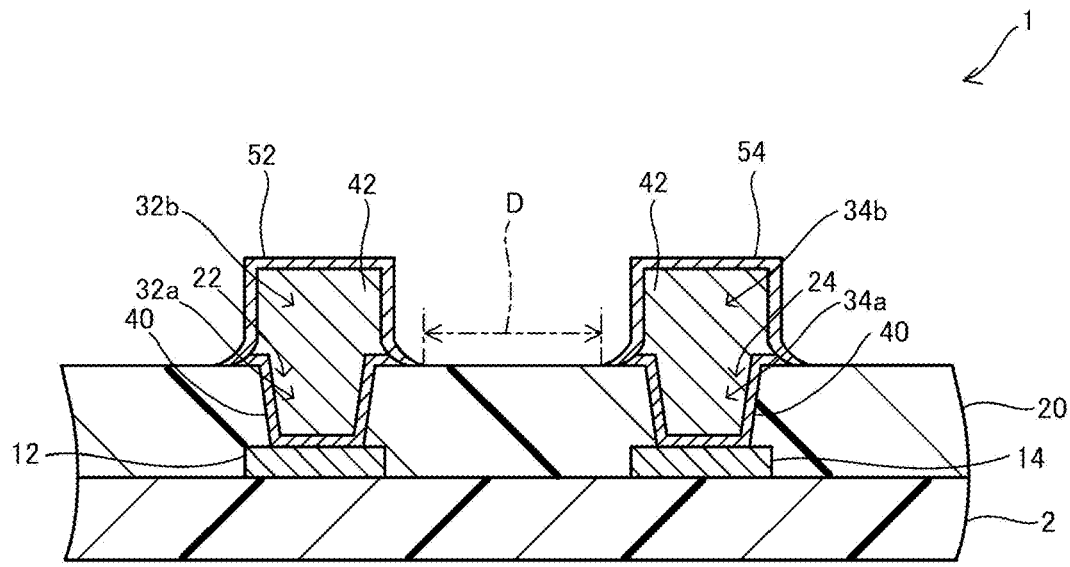
FIG. 1 is a cross-sectional view schematically illustrating a part of a printed wiring board according to an embodiment of the present invention.

Embodiments will now be described with reference to the accompanying drawings, wherein like reference numerals designate corresponding or identical elements throughout the various drawings.

Embodiment

FIG. 1 is a cross-sectional view illustrating a part of a printed wiring board 1 of an embodiment. As illustrated in FIG. 1, the printed wiring board 1 includes a resin insulating layer 2, multiple pads (12, 14), an uppermost resin insulating layer 20, via conductors (32a, 34a), metal posts (32b, 34b), and plating films (52, 54).

The resin insulating layer 2 can form a core substrate. The resin insulating layer 2 can form a resin insulating layer that forms a build-up layer. The resin insulating layer 2 is formed using a thermosetting resin. The resin insulating layer 2 may contain inorganic particles such as silica particles. The resin insulating layer 2 may contain a reinforcing material such as a glass cloth.

The pads (12, 14) are provided on the resin insulating layer 2. FIG. 1 illustrates only two pads (12, 14). However, pads (not illustrated in the drawings) other than the two pads (12, 14) may be provided on the resin insulating layer 2. The pad 12 and the pad 14 are provided adjacent to each other. The pads (12, 14) are pads for mounting an electronic component. The pads (12, 14) are formed of a conductive metal containing copper as a main component.

The uppermost resin insulating layer 20 is formed on the resin insulating layer 2 and the pads (12, 14). The uppermost resin insulating layer 20 has an opening 22 that exposes the pad 12 and an opening 24 that exposes the pad 14. The uppermost resin insulating layer 20 is formed of a solder resist of a type that can be cured by UV (ultraviolet) light (so-called UV-curable solder resist). In another example, the uppermost resin insulating layer 20 may be formed using a thermosetting resin.

The via conductor (32a) is formed on the pad 12 exposed from the opening 22. The via conductor (32a) fills the opening 22. The metal post (32b) is formed on the via conductor (32a) and the uppermost resin insulating layer 20 around the via conductor (32a). The via conductor (32a) and the metal post (32b) are formed of a conductive metal containing copper as a main component. The via conductor (32a) and the metal post (32b) are formed of a seed layer 40 and an electrolytic plating film 42 on the seed layer 40.

Figure 2:
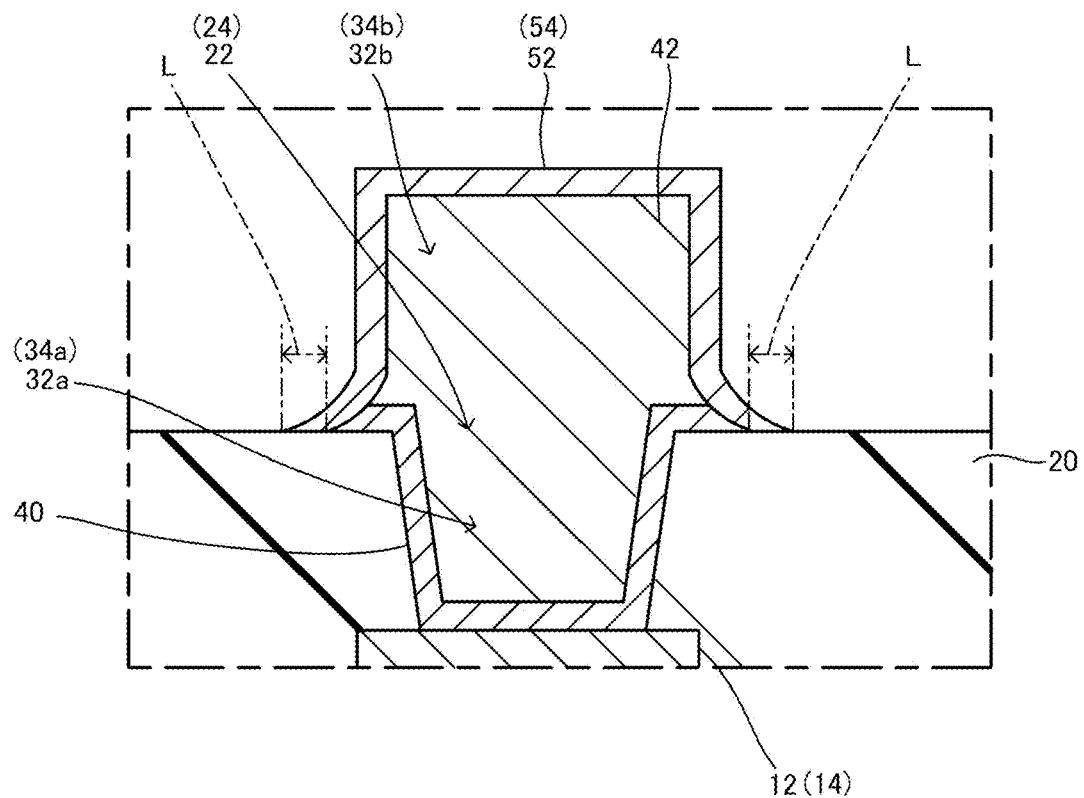
FIG. 2 is an enlarged cross-sectional view schematically illustrating a via conductor and a metal post.

FIG. 2 is an enlarged cross-sectional view illustrating the via conductor (32a) and the metal post (32b). As illustrated in FIG. 2, the via conductor (32a) and the metal post (32b) are integrally formed. The via conductor (32a) is a portion embedded in the opening 22 of the uppermost resin insulating layer 20, and the metal post (32b) is a portion protruding upward from an upper surface of the uppermost resin insulating layer 20. A part of the metal post (32b) is formed on the uppermost resin insulating layer 20 around the opening 22. A side surface of the metal post (32b) has a flared bottom toward the uppermost resin insulating layer 20. A portion of the side surface of the metal post (32b) near the uppermost resin insulating layer 20 extends outward.

As illustrated in FIG. 1, the via conductor (34a) is formed on the pad 14 exposed from the opening 24. The via conductor (34a) fills the opening 24. The metal post (34b) is formed on the via conductor (34a) and the uppermost resin insulating layer 20 around the via conductor (34a). The via conductor (34a) and the metal post (34b) are formed of a conductive metal containing copper as a main component. The via conductor (34a) and the metal post (34b) are formed of a seed layer 40 and an electrolytic plating film 42 on the seed layer 40.

As illustrated in FIG. 2, the via conductor (34a) and the metal post (34b) are integrally formed. The via conductor (34a) is a portion embedded in the opening 24 of the uppermost resin insulating layer 20, and the metal post (34b) is a portion protruding upward from the upper surface of the uppermost resin insulating layer 20. A part of the metal post (34b) is formed on the uppermost resin insulating layer 20 around the opening 24. A side surface of the metal post (34b) has a flared bottom toward the uppermost resin insulating layer 20. A portion of the side surface of the metal post (34b) near the uppermost resin insulating layer 20 extends outward.

As illustrated in FIGS. 1 and 2, the plating film 52 covers the metal post (32b) and the uppermost resin insulating layer 20 around the metal post (32b). The plating film 52 is formed of a tin film or a nickel film and a tin film on the nickel film. As illustrated in FIG. 2, a length (L) of a portion of the plating film 52 that covers the uppermost resin insulating layer 20 is 5 μm or less. As illustrated in FIG. 1, the plating film 54 covers the metal post (34b) and the uppermost resin insulating layer 20 around the metal post (34b). The plating film 54 is formed of a tin film or a nickel film and a tin film on the nickel film. As illustrated in FIG. 2, a length (L) of a portion of the plating film 54 that covers the uppermost resin insulating layer 20 is 5 μm or less.

As illustrated in FIG. 1, a distance (D) between the plating film 52 and the plating film 54 is 20 μm or more. The distance (D) can be said to be a distance between a portion of the plating film 52 that covers the insulating layer 20 and is closest to plating film 54 and an outermost portion of the plating film 54 that covers the insulating layer 20. Since the distance (D) is 20 μm or more, occurrence of a short circuit between the plating film 52 and the plating film 54 is suppressed in a manufacturing process of the printed wiring board 1.

According to the printed wiring board 1 of the embodiment, the metal posts (32b, 34b) and the uppermost resin insulating layer 20 around the metal posts (32b, 34b) are covered by the plating films (52, 54). Therefore, in a manufacturing process of the printed wiring board 1, even when the seed layer 40 formed on the uppermost resin insulating layer 20 is removed by etching, that the metal posts (32b, 34b) are partially removed by an etching solution is suppressed. As a result, that the metal posts (32b, 34b) partially become thin is suppressed. High connection reliability between the metal posts (32b, 34b) and the via conductors (32a, 34a) and the pads (12, 14) is ensured. High adhesion between the metal posts (32b, 34b) and the uppermost resin insulating layer 20 is also ensured. The metal posts (32b, 34b) of the embodiment are examples of a "first metal post" and a "second metal post".

Method for Manufacturing Printed Wiring Board

Figure 3A:
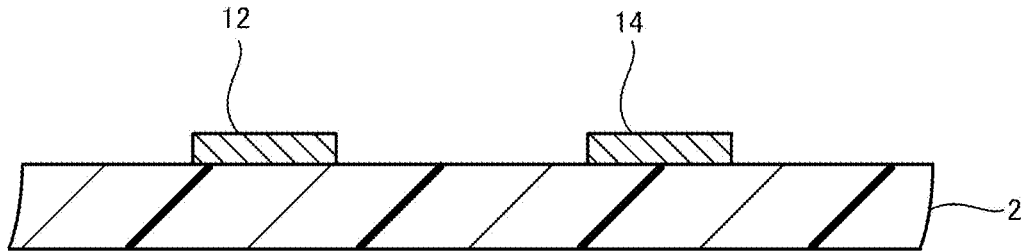
FIG. 3A is a cross-sectional view schematically illustrating a method for manufacturing a printed wiring board according to an embodiment of the present invention.

FIGS. 3A-3J illustrate a method for manufacturing the printed wiring board 1 of the embodiment. FIGS. 3A-3J are cross-sectional views. FIG. 3A illustrates the resin insulating layer 2 and the pads (12, 14) on the resin insulating layer 2. The pads (12, 14) are formed using an SAP (Semi Additive Process) method. It is also possible that the pads (12, 14) are formed using a subtractive method.

Figure 3B:
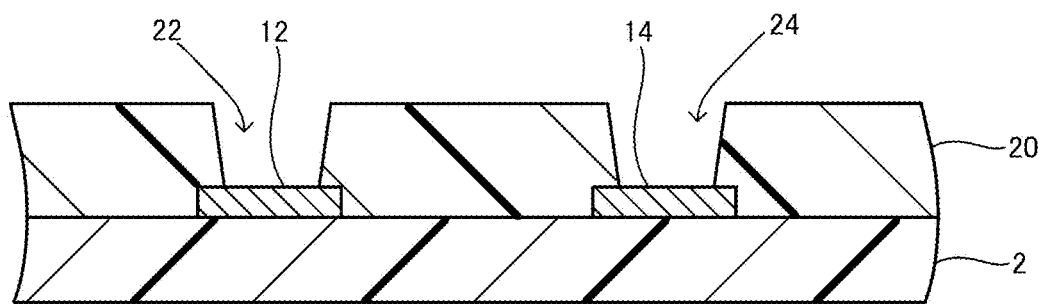
FIG. 3B is a cross-sectional view schematically illustrating a method for manufacturing a printed wiring board according to an embodiment of the present invention.

As illustrated in FIG. 3B, the uppermost resin insulating layer 20 having the openings (22, 24) is formed on the resin insulating layer 2 and the pads (12, 14). The pad 12 is exposed from the opening 22. The pad 14 is exposed from the opening 24. The uppermost resin insulating layer 20 is formed by applying a UV-curable solder resist film, positioning a mask in regions where the openings (22, 24) are formed, and performing an exposure treatment and a development treatment in this order.

Figure 3C:
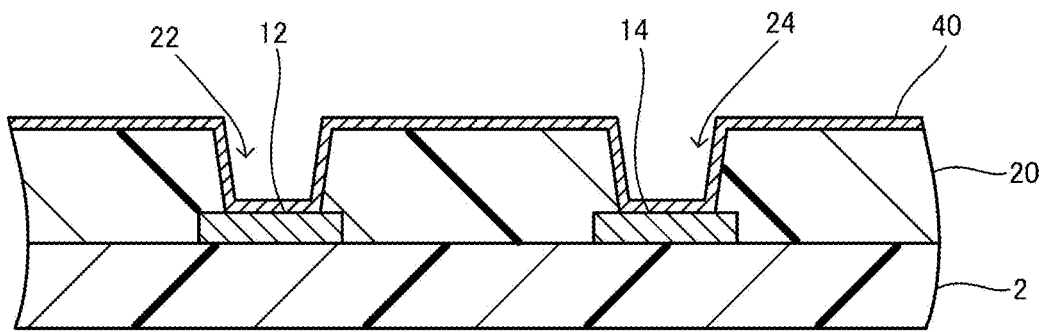
FIG. 3C is a cross-sectional view schematically illustrating a method for manufacturing a printed wiring board according to an embodiment of the present invention.

As illustrated in FIG. 3C, the seed layer 40 is formed on the uppermost resin insulating layer 20 and the pads (12, 14) exposed from the openings (22, 24). The seed layer 40 is formed by non-electrolytic plating.

Figure 3D:
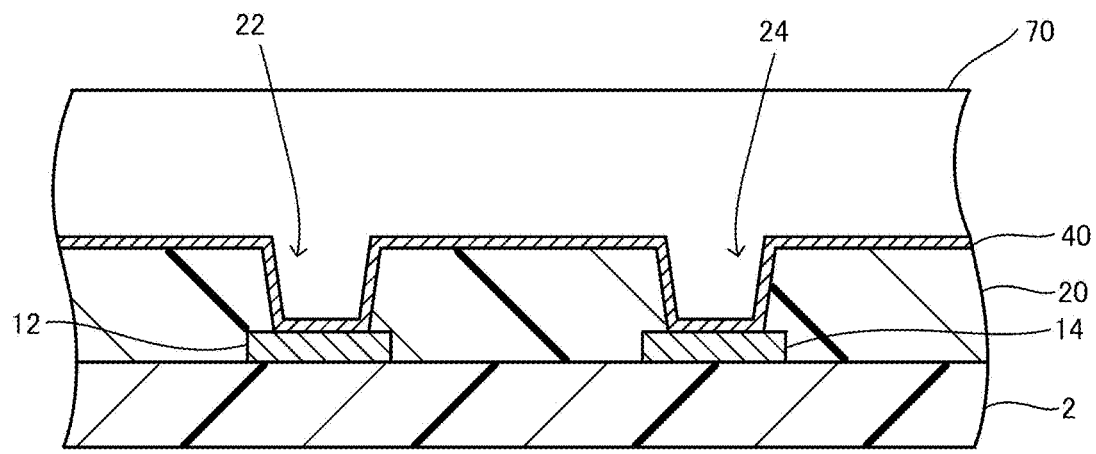
FIG. 3D is a cross-sectional view schematically illustrating a method for manufacturing a printed wiring board according to an embodiment of the present invention.

As illustrated in FIG. 3D, a UV-curable dry resist film 70 is applied on the seed layer 40. In another example, a liquid UV-curable resist may be applied instead of the dry resist film 70. At this point, the dry resist film 70 has not been cured. The dry film 70 is applied to an entire surface of the seed layer 40. The dry film 70 fills the openings (22, 24).

Figure 3E:
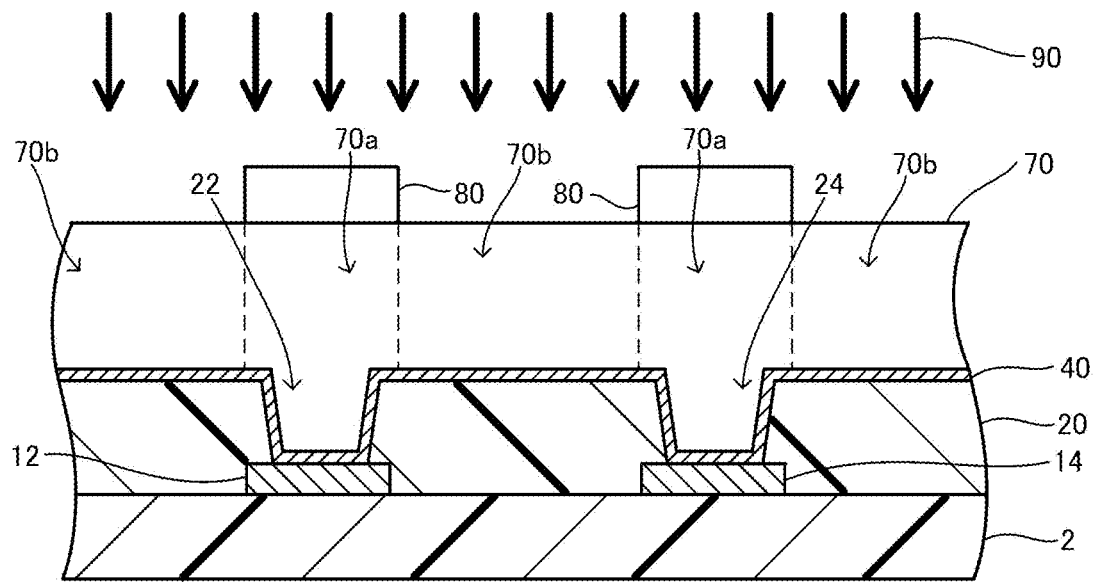
FIG. 3E is a cross-sectional view schematically illustrating a method for manufacturing a printed wiring board according to an embodiment of the present invention.

As illustrated in FIG. 3E, a mask 80 is positioned on the dry resist film 70. The mask 80 is positioned so as to cover regions corresponding to above the openings (22, 24). In this state, the dry resist film 70 is irradiated with UV light from above (see arrows 90 in FIG. 3E). First regions (70a) of the dry resist film 70 that are covered by the mask 80 are not irradiated with UV light. Therefore, the first regions (70a) are not cured. On the other hand, a second region (70b) of the dry resist film 70 that is not covered by the mask 80 is irradiated with UV light. Therefore, the second region (70b) is cured. However, when viewed from an upper surface of the second region (70b), UV light transmittance decreases toward the seed layer 40. Therefore, of the second region (70b), a portion closer to the upper surface has a higher curing rate, and a portion closer to the seed layer 40 has a lower curing rate. The curing rate of the second region (70b) gradually decreases from the upper surface of the dry resist film 70 toward the seed layer 40.

After that, the dry resist film 70 is subjected to a development treatment. In the development treatment, uncured portions of the dry resist film 70 are removed using a liquid developer (for example, a dilute alkaline aqueous solution). As a result, portions corresponding to the first regions (70a) that are not irradiated with UV light and have not been cured are removed. Further, the second region (70b) adjacent to the first regions (70a) is also partially removed by the liquid developer. In this case, a degree of removal of the second region (70b) adjacent to the first regions (70a) differs depending on a degree of curing of the second region (70b). The degree of removal of the second region (70b) adjacent to the first regions (70a) is higher for a lower degree of curing.

Figure 3F:
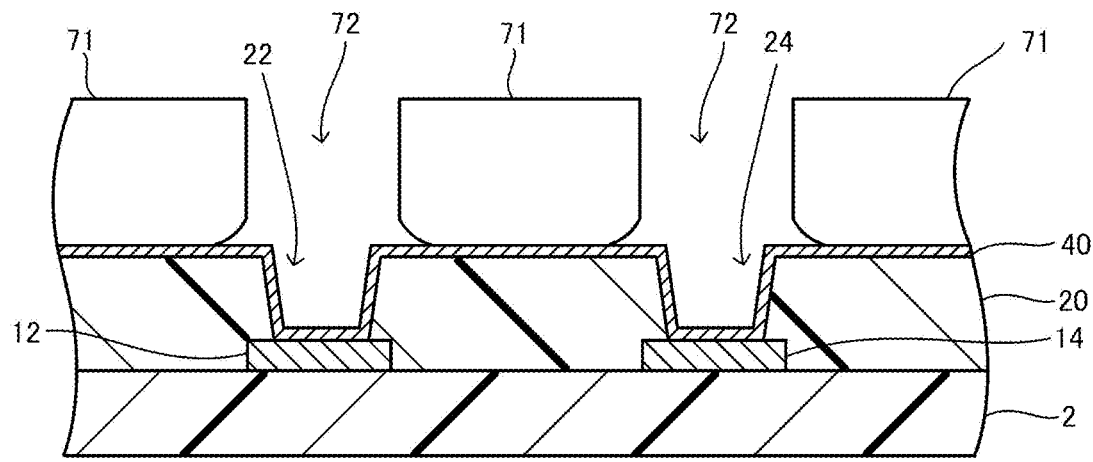
FIG. 3F is a cross-sectional view schematically illustrating a method for manufacturing a printed wiring board according to an embodiment of the present invention.

As illustrated in FIG. 3F, by performing the development treatment, a plating resist 71 is formed on the seed layer 40. The plating resist 71 corresponds to the cured second region (70b). The plating resist 71 has resist openings 72. The resist openings 72 are formed in portions where the removed first regions (70a) were positioned. The resist openings 72 are openings for forming the via conductors (32a, 34a), the metal posts (32b, 34b) and the plating films (52, 54) (FIG. 1). Portions of side surfaces (surfaces facing the resist openings 72) of the plating resist 71 that are near the seed layer 40 are hollowed out inward. The hollowed out portions of the side surfaces of the plating resist 71 are formed due to that a portion of a lower degree of curing of the second region (70b) (FIG. 3E) is removed more by the development treatment. That is, each of the resist openings 72 has a flared bottom toward the uppermost resin insulating layer 20. A portion of each resist opening 72 near the uppermost resin insulating layer 20 extends outward.

Figure 3G:
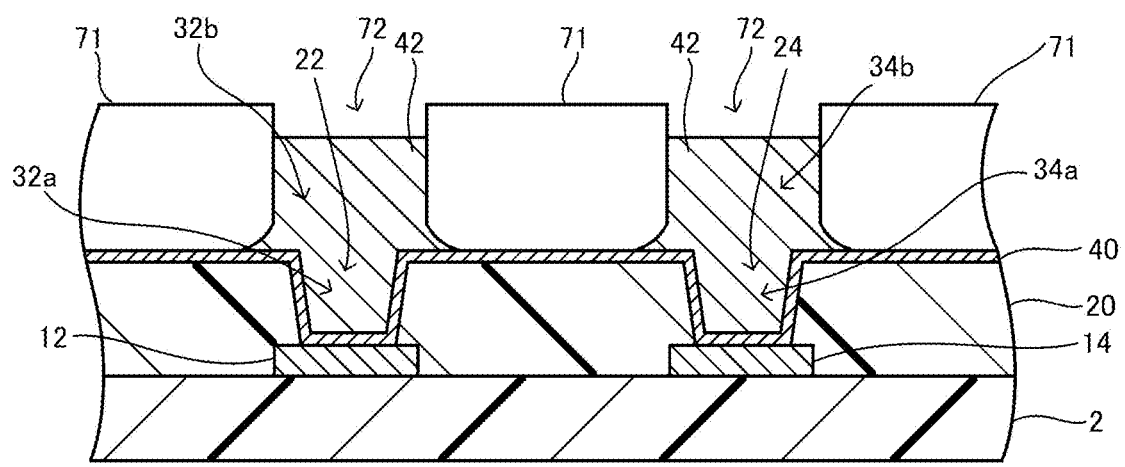
FIG. 3G is a cross-sectional view schematically illustrating a method for manufacturing a printed wiring board according to an embodiment of the present invention.

As illustrated in FIG. 3G, the electrolytic plating film 42 is formed on the seed layer 40 exposed from the plating resist 71. The electrolytic plating film 42 fills the openings (22, 24). The electrolytic plating film 42 also fills the resist openings 72. By the seed layer 40 and the electrolytic plating film 42 formed on the seed layer 40, the via conductors (32a, 34a) and the metal posts (32b, 34b) are formed. The via conductors (32a, 34a) are the portions embedded in the openings (22, 24) of the uppermost resin insulating layer 20, and the metal posts (32b, 34b) are the portions protruding upward from the upper surface of the uppermost resin insulating layer 20.

Figure 3H:
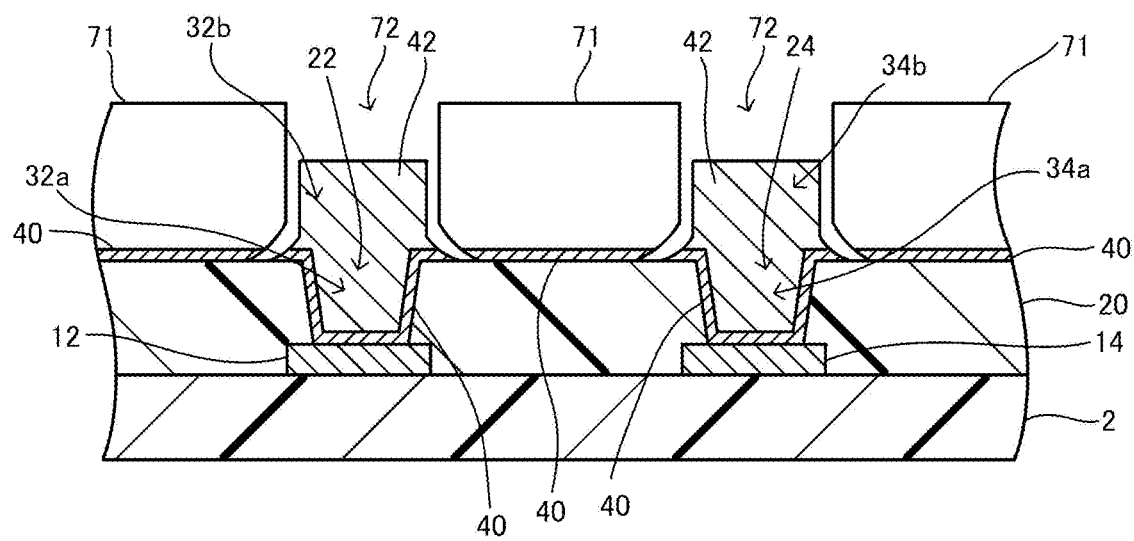
FIG. 3H is a cross-sectional view schematically illustrating a method for manufacturing a printed wiring board according to an embodiment of the present invention.

As illustrated in FIG. 3H, etching is performed to roughen surfaces of the formed metal posts (32b, 34b). By roughening the surfaces of the metal posts (32b, 34b), adhesion between the metal posts (32b, 34b) and the plating films (52, 54) (to be formed later) (FIG. 1) is improved. By performing etching, the metal posts (32b, 34b) are partially removed and are reduced in width and height. As a result, gaps are formed between the metal posts (32b, 34b) and the plating resist 71.

Figure 3I:
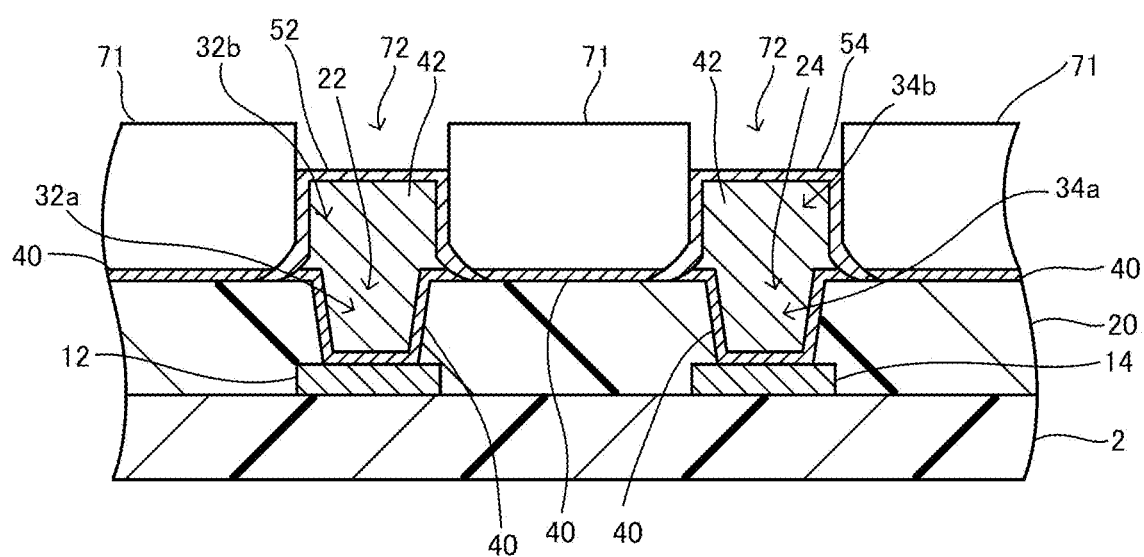
FIG. 3I is a cross-sectional view schematically illustrating a method for manufacturing a printed wiring board according to an embodiment of the present invention.

As illustrated in FIG. 3I, the plating films (52, 54) are formed. The plating films (52, 54) are formed by electrolytic plating. The plating films (52, 54) are tin films. It is also possible that each of the plating films (52, 54) is formed of a nickel film and a tin film on the nickel film. The plating films (52, 54) are formed on upper surfaces of the metal posts (32b, 34b). Further, the plating films (52, 54) are also formed in the gaps between the metal posts (32b, 34b) and the plating resist 71 (FIG. 3I). As a result, the plating films (52, 54) covering the metal posts (32b, 34b) and the uppermost resin insulating layer 20 around the metal posts (32b, 34b) are formed.

Figure 3J:
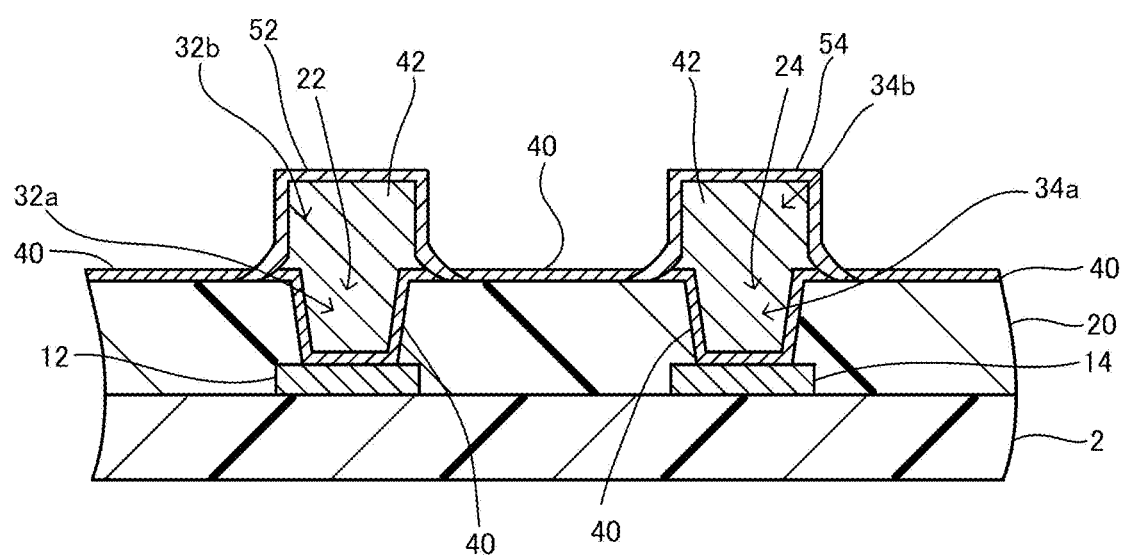
FIG. 3J is a cross-sectional view schematically illustrating a method for manufacturing a printed wiring board according to an embodiment of the present invention.

As illustrated in FIG. 3J, the plating resist 71 is removed. After that, the seed layer 40 exposed from the plating films (52, 54) is removed. The printed wiring board 1 (FIG. 1) of the embodiment is obtained. In this case, since the metal posts (32b, 34b) and the uppermost resin insulating layer 20 around the metal posts (32b, 34b) are covered by the plating films (52, 54), even when the seed layer 40 is removed by etching, that the metal posts (32b, 34b) are prevented by an etching solution is suppressed. As a result, that the metal posts (32b, 34b) partially become thin is suppressed. High connection reliability between the metal posts (32b, 34b) and the via conductors (32a, 34a) and the pads (12, 14) is ensured. High adhesion between the metal posts (32b, 34b) and the uppermost resin insulating layer 20 is also ensured.

In a manufacturing process of the package substrate of Japanese Patent Application Laid-Open Publication No. 2011-124559, after the solder bumps are formed, a dry film pattern for forming the peeling prevention layer and the post terminals is removed. After that, a plating seed layer formed on the insulating layer is removed by etching.

However, it is thought that, since both the plating seed layer and the peeling prevention layer are formed of copper, when the plating seed layer is removed, a part of the peeling prevention layer protruding from the upper surface of the insulating layer is partially removed by an etching solution. As a result, it is thought that the peeling prevention layer partially becomes thin and connection reliability with the conductor pads decreases.

A printed wiring board according to an embodiment of the present invention includes: a resin insulating layer; pads formed on the resin insulating layer; an uppermost resin insulating layer that is formed on the resin insulating layer and the pads and has openings exposing the pads; via conductors formed on the pads exposed from the openings; metal posts formed on the via conductors and the uppermost resin insulating layer around the via conductors; and a plating film that covers the metal posts and the uppermost resin insulating layer around the metal posts.

In a printed wiring board according to an embodiment of the present invention, the metal posts and the uppermost resin insulating layer around the metal posts may be covered by the plating film. Therefore, in a manufacturing process of the printed wiring board, even when the seed layer formed on the uppermost resin insulating layer is removed by etching, that the metal posts are partially removed by an etching solution is suppressed. As a result, that the metal posts partially become thin is suppressed. High connection reliability between the metal posts and the via conductors and the pads is ensured.

Obviously, numerous modifications and variations of the present invention are possible in light of the above teachings. It is therefore to be understood that within the scope of the appended claims, the invention may be practiced otherwise than as specifically described herein.

What is claimed is:
1. A printed wiring board, comprising:
a resin insulating layer;
a plurality of pads formed on the resin insulating layer;
an uppermost resin insulating layer formed on the resin insulating layer such that the uppermost resin insulating layer is covering the plurality of pads and has a plurality of openings exposing the plurality of pads, respectively;
a plurality of via conductors formed in the uppermost resin insulating layer such that the plurality of via conductors is formed on the plurality of pads exposed from the plurality of openings in the uppermost resin insulating layer, respectively;
a plurality of metal posts formed on the plurality of via conductors such that each of the metal posts has a portion on a surface of the uppermost resin insulating layer around the via conductors and a side surface having a flared bottom extending toward the uppermost resin insulating layer; and a plurality of plating films formed on the plurality of metal posts such that the plurality of plating films is covering the plurality of metal posts and the surface of the uppermost resin insulating layer around the plurality of metal posts, respectively, wherein the plurality of via conductors is formed such that each of the via conductors includes a seed layer and an electrolytic plating film formed on the seed layer, and the plurality of via conductors and the plurality of metal posts are integrally formed in a same process such that each of the metal posts has an integral structure with a respective one of the via conductors.

2. The printed wiring board according to claim 1, wherein each of the metal posts has the integral structure comprising an electrolytic plating structure with the respective one of the via conductors, and each of the plating films is formed on the electrolytic plating structure in a respective one of the metal posts.

3. The printed wiring board according to claim 1, wherein the plurality of metal posts includes a first metal post and a second metal post formed adjacent to the first metal post such that a distance between the plating film on the first metal post and the plating film on the second metal post is 20 μm or more.

4. The printed wiring board according to claim 1, wherein the plurality of plating films is formed such that each of the plating films is formed of a tin film or a nickel film and a tin film on the nickel film.

5. The printed wiring board according to claim 2, wherein the plurality of plating films is formed such that each of the plating films is formed of a tin film or a nickel film and a tin film on the nickel film.

6. The printed wiring board according to claim 1, wherein the plurality of plating films is formed such that each of the plating films is covering the surface of the uppermost resin insulating layer in a length of 5 μm or less.

7. The printed wiring board according to claim 1, wherein the plurality of via conductors and the plurality of metal posts are formed in the same process comprising electrolytic plating such that each of the metal posts has the integral structure comprising an electrolytic plating structure with the respective one of the via conductors.

8. The printed wiring board according to claim 1, wherein the plurality of plating films is formed such that each of the plating films comprises a tin film or a nickel film and a tin film on the nickel film.

9. The printed wiring board according to claim 1, wherein the plurality of via conductors and the plurality of metal posts are integrally formed such that each of the metal posts has the integral structure comprising copper with the respective one of the via conductors.

10. The printed wiring board according to claim 3, wherein the plurality of plating films is formed such that the plurality of plating films is covering the surface of the uppermost resin insulating layer around the plurality of metal posts, respectively.

11. The printed wiring board according to claim 3, wherein the plurality of plating films is formed such that each of the plating films is formed of a tin film or a nickel film and a tin film on the nickel film.

12. The printed wiring board according to claim 10, wherein the plurality of plating films is formed such that each of the plating films is covering the surface of the uppermost resin insulating layer in a length of 5 μm or less.

13. The printed wiring board according to claim 10, wherein the plurality of via conductors and the plurality of metal posts are formed in the same process comprising electrolytic plating such that each of the metal posts has the integral structure comprising an electrolytic plating structure with the respective one of the via conductors.

14. The printed wiring board according to claim 3, wherein the plurality of plating films is formed such that each of the plating films comprises a tin film or a nickel film and a tin film on the nickel film.

15. The printed wiring board according to claim 10, wherein the plurality of via conductors and the plurality of metal posts are integrally formed such that each of the metal posts has the integral structure comprising copper with the respective one of the via conductors.

16. The printed wiring board according to claim 6, wherein the plurality of plating films is formed such that each of the plating films is formed of a tin film or a nickel film and a tin film on the nickel film.

17. The printed wiring board according to claim 2, wherein the plurality of plating films is formed such that each of the plating films is covering the surface of the uppermost resin insulating layer in a length of 5 μm or less.

18. The printed wiring board according to claim 3, wherein the plurality of via conductors and the plurality of metal posts are formed in the same process comprising electrolytic plating such that each of the metal posts has the integral structure comprising an electrolytic plating structure with the respective one of the via conductors.

19. The printed wiring board according to claim 6, wherein the plurality of plating films is formed such that each of the plating films comprises a tin film or a nickel film and a tin film on the nickel film.

20. The printed wiring board according to claim 3, wherein the plurality of via conductors and the plurality of metal posts are integrally formed such that each of the metal posts has the integral structure comprising copper with the respective one of the via conductors.

* * * * *